(12) United States Patent
Zhuang et al.

(10) Patent No.: US 7,157,287 B2
(45) Date of Patent: *Jan. 2, 2007

(54) METHOD OF SUBSTRATE SURFACE TREATMENT FOR RRAM THIN FILM DEPOSITION

(75) Inventors: Wei-Wei Zhuang, Vancouver, WA (US); Tingkai Li, Vancouver, WA (US); Wei Pan, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 281 days.

This patent is subject to a terminal disclaimer.

(21) Appl. No.: 10/855,088

(22) Filed: May 27, 2004

(65) Prior Publication Data

US 2005/0266686 A1   Dec. 1, 2005

(51) Int. Cl.
   *H01L 21/20* (2006.01)
(52) U.S. Cl. .............................. 438/3; 438/48; 438/57; 257/E27.006
(58) Field of Classification Search .................... 438/3, 438/48, 57
   See application file for complete search history.

(56) References Cited

U.S. PATENT DOCUMENTS 6,204,139 B1   3/2001  Liu et al.
6,824,814 B1 * 11/2004  Zhuang et al. ................. 427/79
2003/0219534 A1 * 11/2003  Zhuang et al. .............. 427/240
2004/0005483 A1 *  1/2004  Lin ............................. 428/702

OTHER PUBLICATIONS

Liu et al., *Electric-pulse-induced reversible resistance change effect in magnetoresistive films*, Applied Physics Letters, vol. 76, No. 19; May 8, 2000, pp. 2749-2751.

* cited by examiner

*Primary Examiner*—Asok K. Sarkar
*Assistant Examiner*—Victor V. Yevsikov
(74) *Attorney, Agent, or Firm*—Robert D. Varitz, PC

(57) ABSTRACT

A method of fabricating a CMR thin film for use in a semiconductor device includes preparing a CMR precursor in the form of a metal acetate based acetic acid solution; preparing a wafer; placing a wafer in a spin-coating chamber; spin-coating and heating the wafer according to the following: injecting the CMR precursor into a spin-coating chamber and onto the surface of the wafer in the spin-coating chamber; accelerating the wafer to a spin speed of between about 1500 RPM to 3000 RPM for about 30 seconds; baking the wafer at a temperature of about 180° C. for about one minute; ramping the temperature to about 230° C.; baking the wafer for about one minute at the ramped temperature; annealing the wafer at about 500° C. for about five minutes; repeating said spin-coating and heating steps at least three times; post-annealing the wafer at between about 500° C. to 600° C. for between about one to six hours in dry, clean air; and completing the semiconductor device.

14 Claims, 6 Drawing Sheets

METHOD OF SUBSTRATE SURFACE TREATMENT FOR RRAM THIN FILM DEPOSITION

FIELD OF THE INVENTION

This invention relates to fabrication of RRAM devices, and specifically to the use of surface-treated transition metals as the substrate for RRAM thin film deposition, which surface-treated transition metals provide the thin films with reversible resistance change properties.

BACKGROUND OF THE INVENTION

Perovskite metal oxide thin films, such as $Pr_{0.3}Ca_{0.7}MnO_3$ (PCMO), exhibit reversible resistance change when an electric pulse is applied. A PCMO thin film has been grown on both epitaxial $YBa_2Cu_3O_7$ (YBCO) and partial epitaxial Pt substrates via pulsed laser abrasion (PLA) technique, Liu et al., *Electric-pulse-induced reversible resistance change effect in magnetoresistive films*, Applied Physics Letters, 76, 2749, 2000; and Liu et al., U.S. Pat. No. 6,204,139, granted Mar. 20, 2001, for *Method of switching the properties of perovskite materials used in thin film resistors*. which describes the resistance change which occurred when electric pulses are applied at room temperature to PCMO thin films. The PCMO thin films were deposited on both epitaxial $YBa_2Cu_3O_7$ (YBCO) and partial epitaxial Pt substrates by pulsed laser deposition (PLD). The polarity of the electric pulse determines the character of the resistance change, i.e., increase or decrease. X-Ray diffraction (XRD) polar figures confirm the epitaxial properties of PCMO thin films.

An electrically programmable resistance, non-volatile memory device, operable at room temperature, was fabricated using PCMO epitaxially grown on YBCO on $LaAlO_3$, as published by Liu et al. This type of memory may be reversibly programmed by a reversed short electrical pulse. The memory cell is able to produce either single bit or multi-bit information. However, the PCMO must be in crystalline form, which requires that the PCMO must be grown on a specific bottom electrode, such as YBCO, which is not compatible to the state-of-the-art silicon integrated circuit technology. The growth, or crystallization, temperature is relatively high, e.g., >700° C., which renders incorporation of the device into state-of-the-art integrated circuit fabrication very complex. In addition it is not possible to cover the full circuit area with a single grain of PCMO. As the properties of a memory cell which is fabricated on a single grain PCMO crystal and the properties of a memory cell which is fabricated on a multi-grain PCMO crystal, which covers the grain boundary area, are not the same, circuit yield and memory performance problems will occur.

SUMMARY OF THE INVENTION

A method of fabricating a CMR thin film for use in a semiconductor device includes preparing a CMR precursor in the form of a metal acetate based acetic acid solution; preparing a wafer; placing a wafer in a spin-coating chamber; spin-coating and heating the wafer according to the following: injecting the CMR precursor into a spin-coating chamber and onto the surface of the wafer in the spin-coating chamber; accelerating the wafer to a spin speed of between about 1500 RPM to 3000 RPM for about 30 seconds; baking the wafer at a temperature of about 180° C. for about one minute; ramping the temperature to about 230° C.; baking the wafer for about one minute at the ramped temperature; annealing the wafer at about 500° C. for about five minutes; repeating said spin-coating and heating steps at least three times; post-annealing the wafer at between about 500° C. to 600° C. for between about one to six hours in dry, clean air; and completing the semiconductor device.

It is an object of the invention to provide a programmable CMR thin film device using a spin-coating fabrication process.

Another object of the invention is to provide a CMR thin film device which may be programmed by applying a writing pulse having an amplitude of at least 4.5V and a pulse width of at least 50 ns and by applying a reset pulse having a minimum pulse amplitude at least 2V and a pulse width of at least 2 µs.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Transition metals, after a special surface treatment of the method of the invention, may be used as electrodes for the integration of RRAM thin film. Colossal magnetoresistive (CMR) material, such as $Pr_{0.3}Ca_{0.7}MnO_3$ (PCMO), exhibit resistive switching properties upon application of an electrical pulse. The first example of the method of the invention includes fabrication of a PCMO thin film deposited on a substrate of rhodium, surface-treated with an alloy of $Pt_{0.2}Co_{0.8}$. The film demonstrates reversible resistant changes with the application of narrow electric pulses.

PCMO thin films have been found to have reversible resistance change properties. The resistance may be increased to a high resistance state by applying an electric pulse of nanosecond duration, such as 5V electrical amplitude and 100 ns pulse duration time. To reset the resistance to a low resistant state, a microsecond electric pulse, e.g., a 3V amplitude and 10 µs pulse width, may be applied. This unique resistant switch property provides a PCMO thin film with a significant application as a non-volatile memory component.

Figure 1:
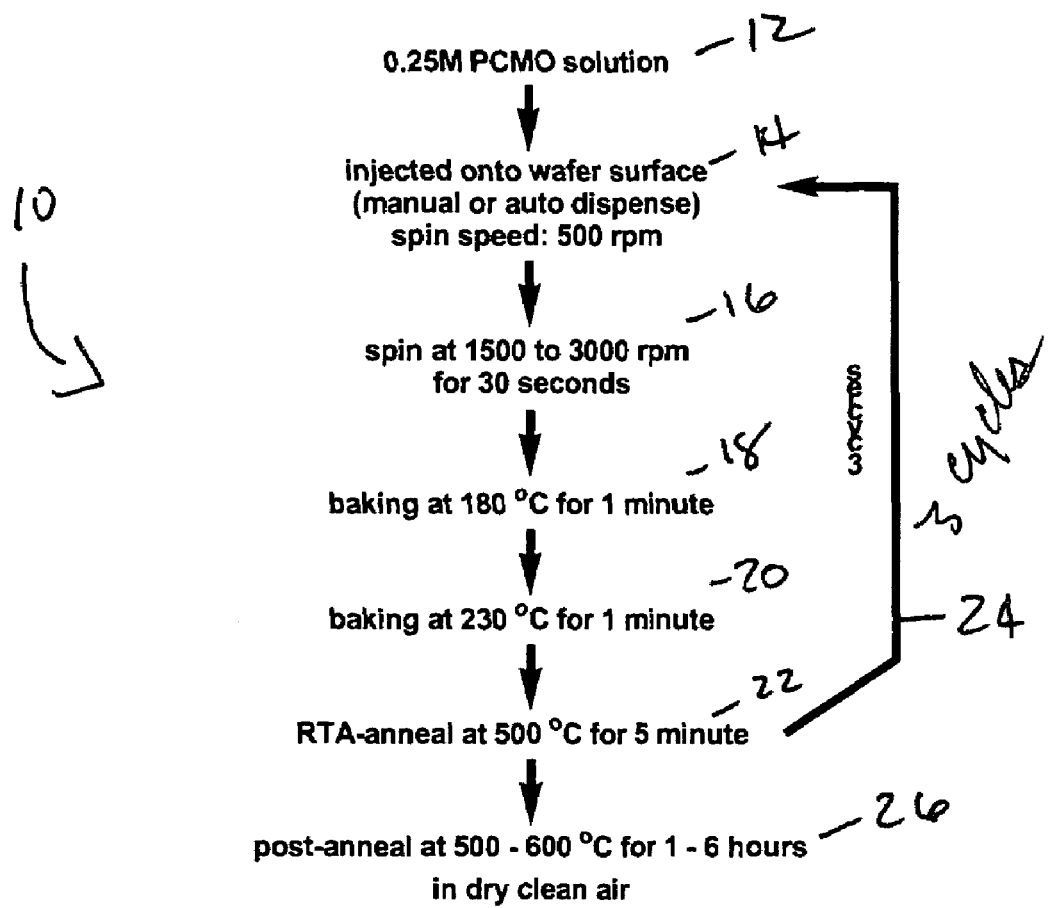
FIG. 1 is a block diagram of the method of the invention.
Figure 2:
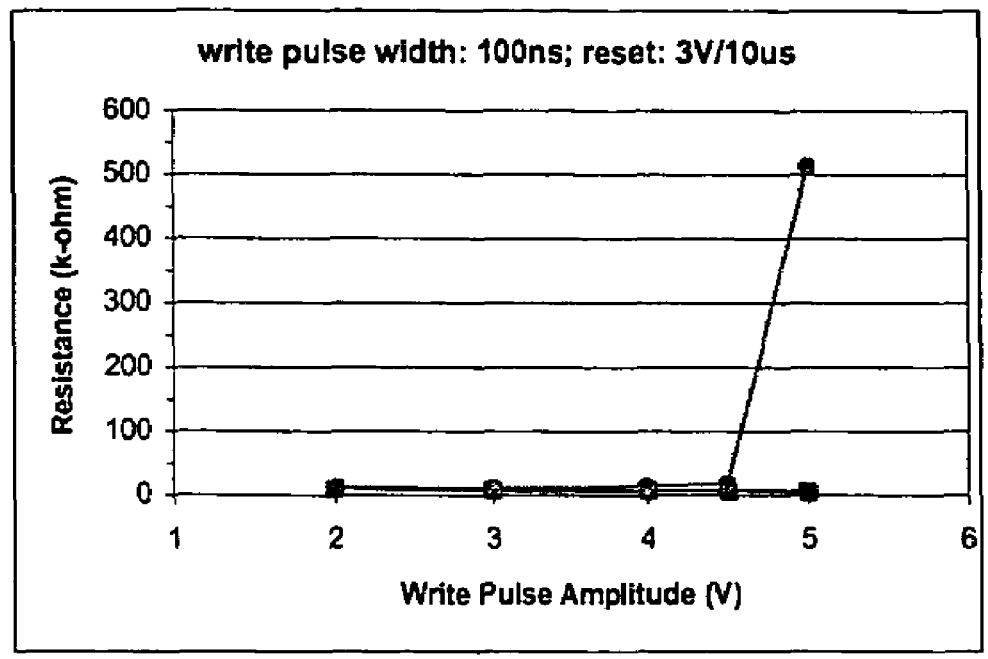
FIGS. 2–5 depict PCMO thin film switching efficiencies.
Figure 3:
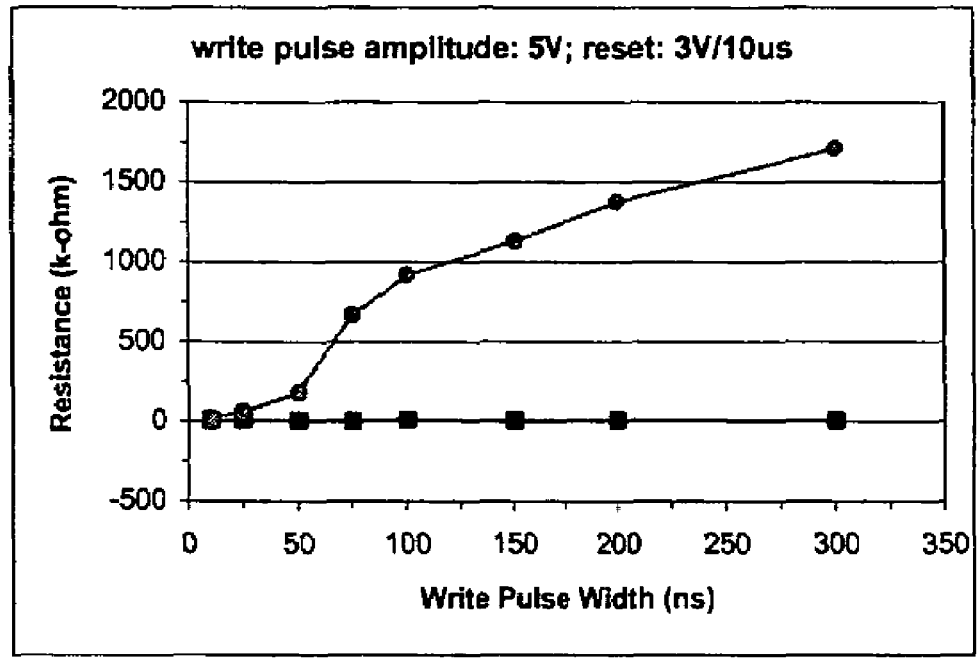
Figure 4:
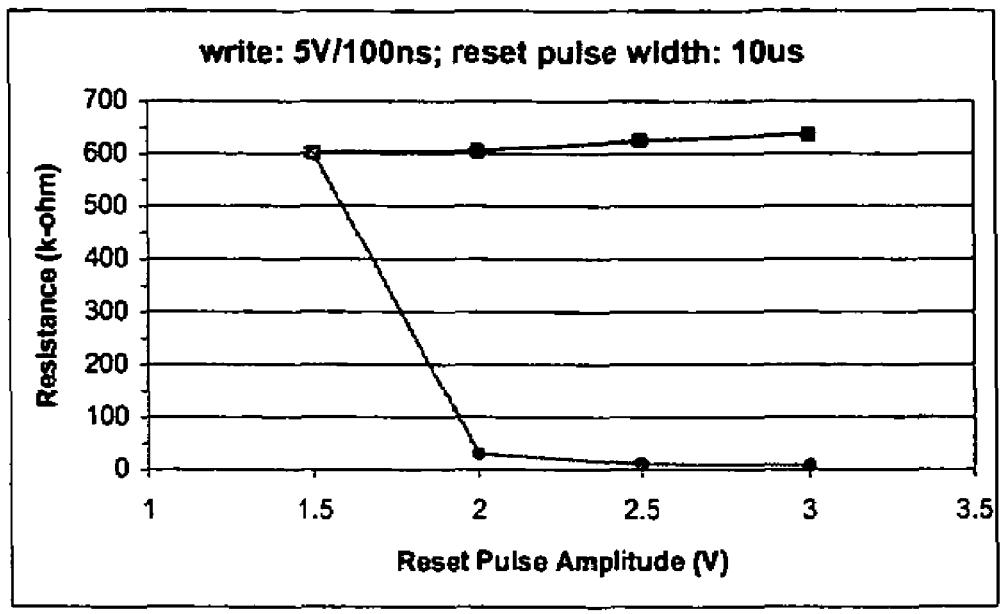
Figure 5:
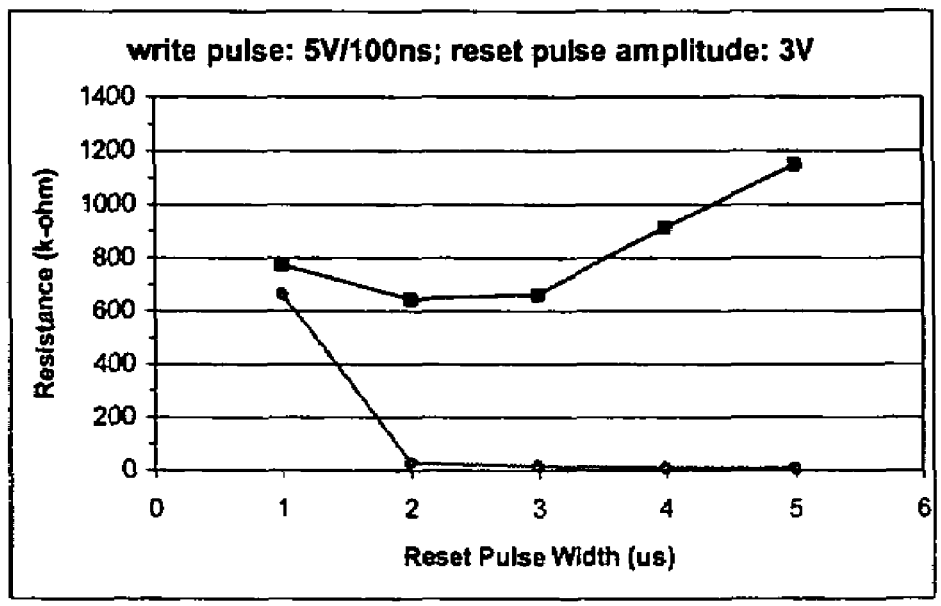

Platinum is the common electrode used in the integration of PCMO thin films, although other transition metals, such as Ir, Ru, Au, Ag and Co, and metal nitrides, such as TiN, TaN, $TiAlN_x$ and $TaAlN_x$, may be used as electrodes in RRAM devices (SLA 534) [1]. In addition to the transition metals, transition metal alloys may also be used as the electrodes for the integration of PCMO thin films. Examples include, but are not limited to, alloys containing Pt, Rh, Pd and Ir CMR materials, and, as used an example herein, PCMO thin films, are spin-coated on the substrate of a rhodium surface treated with a $Pt_{0.2}Co_{0.8}$ alloy. The spin-coating process is described in connection with FIG. 1, wherein the process is depicted generally at 10. The spin-coating precursor is a metal acetate based acetic acid solution, as disclosed in our previous disclosure, Ser. No. 09/822,093, filed Mar. 30, 2001, of Zhuang et al., for *X/Y Alignment Vernier and Method of Fabricating Same*, which is incorporated herein by reference. A 0.25 PCMO solution is prepared, 12. The PCMO solution is injected onto the surface of a wafer in a spin-coating chamber, 14. The wafer is accelerated to a spin speed of between about 1500 RPM to 3000 RPM for about 30 seconds, 16. The spin-coated wafer is baked at a temperature of about 180° C. for about one minute, 18, and the temperature ramped to about 230° C., and the wafer baked for about another minute, 20. The wafer is then RTA annealed at about 500° C. for about five minutes, 22. Steps 14 through 22 are repeated three times, 24. The wafer is then post-annealed at between about 500° C. to 600° C. for between about one to six hours in dry, clean air, 26.

The film integration is Pt/PCMO/Rh treated with $Pt_{0.2}Co_{0.8}$ alloy on a $SiO_2$/silicon wafer. The thin film is post-annealed in air at a temperature ranging from between about 450° C. to 600° C. for between about 5 minutes to 1 hour.

Results of investigation of the electrical properties of PCMO thin film formed according to the method of the invention are presented in FIGS. 2–9. In order to study the writing properties, the thin film resistance was initially set to a low resistant state, and a single writing pulse was applied. Similarly, in the study of reset properties, the resistance was initially set to a high resistant state, and a single reset pulse was applied. The resistance data were read at 0.5V.

As shown in FIGS. 2–5, in order to generate a resistance change, a writing pulse having an amplitude of at least 4.5V and a pulse width of at least 50 ns should be applied. For the reset process, a pulse having a minimum pulse amplitude at least 2V and a pulse width of at least 2 µs should be applied. The resistant switch scales are in a range of one to two orders of magnitude.

Figure 6:
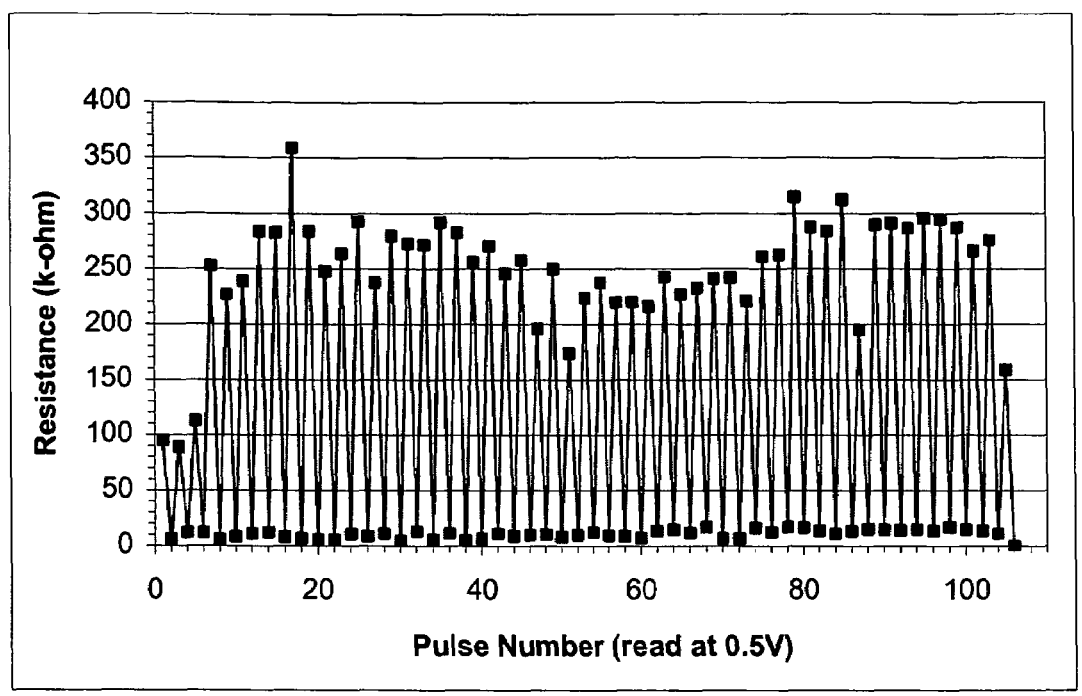
FIG. 6 depicts switching properties of a PCMO thin film fabricated according to the method of the invention.

FIG. 6 depicts switch properties, wherein write operations are conducted at 5 v for 50 ns durations, and reset operations are conducted at 3V for 5 µs durations.

Figure 7:
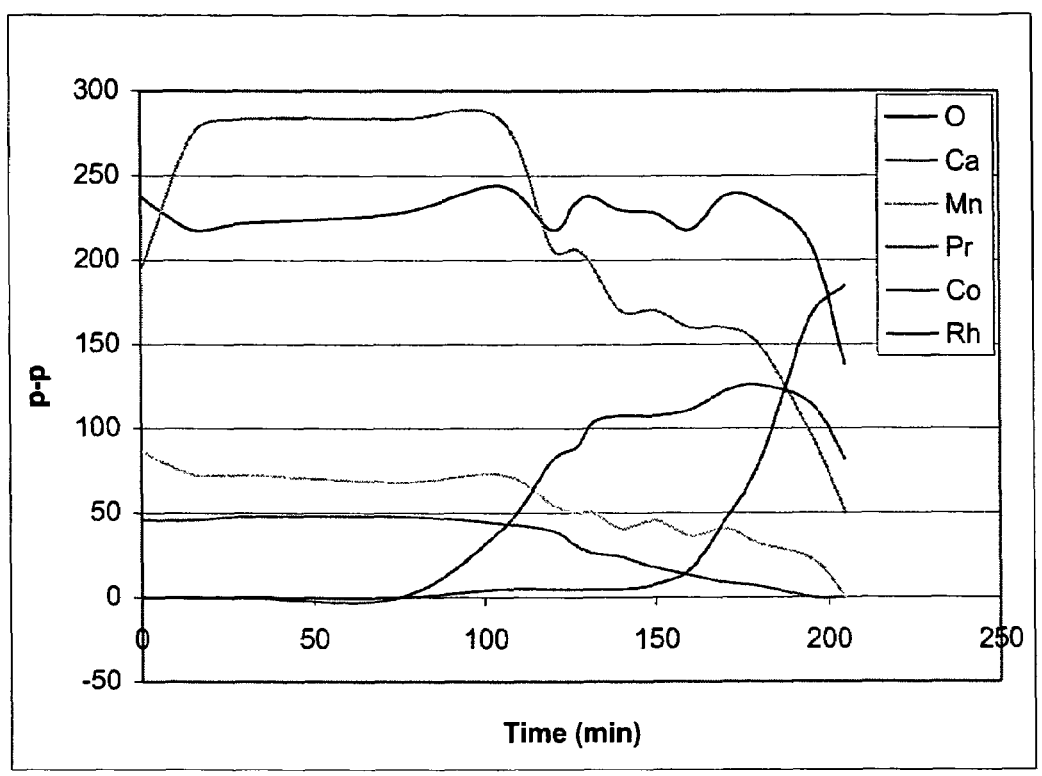
FIG. 7 depicts an Auger analysis of a PCMO thin film fabricated according to the method of the invention.

The results of Auger analysis are shown in FIG. 7, and clearly indicate the presence of a cobalt thin layer on the rhodium metal surface, which has strongly diffused into the PCMO thin film. Platinum was not detected in Auger analysis because of its low concentration.

Figure 8:
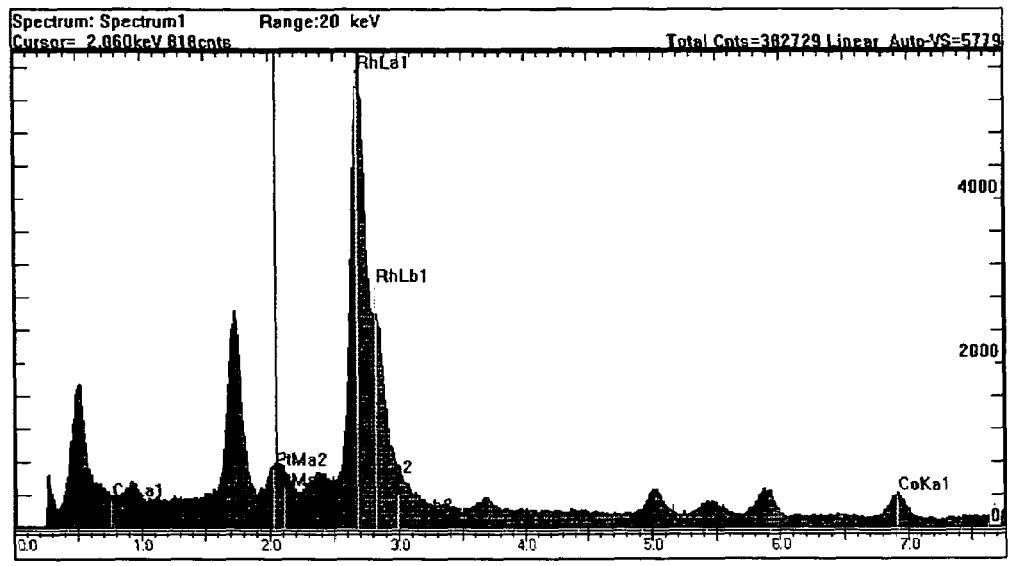
FIG. 8 depicts an EDX of a Rh—Pt—Co alloy substrate and PCMO thin film.
Figure 9:
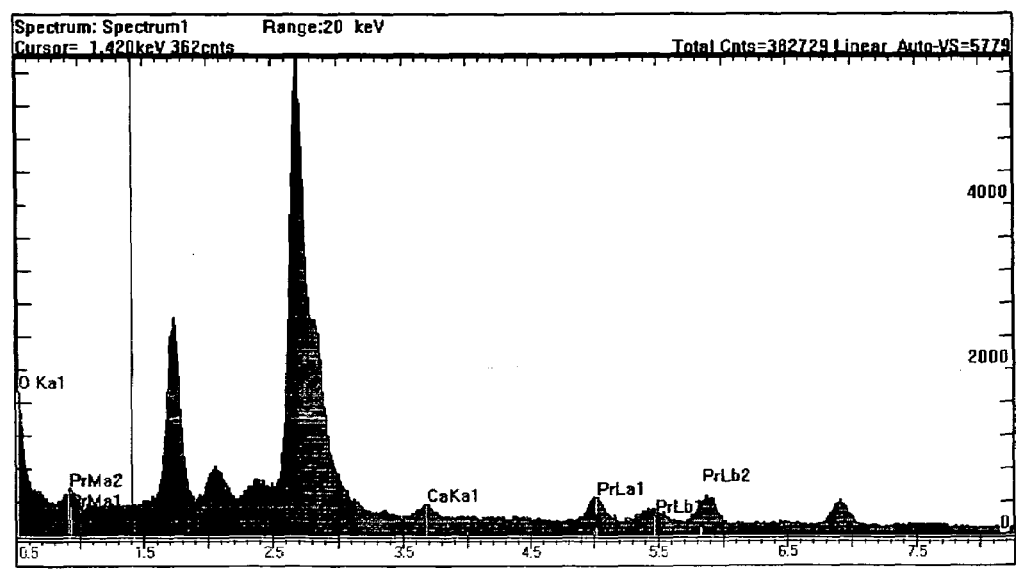
FIG. 9 depicts an EDX of a Rh substrate treated with a $Pt_{0.2}Co_{0.8}$ alloy.

FIGS. 8 and 9 depict energy dispersive x-ray (EDX) spectroscopy of the thin film, wherein FIG. 8 depicts the EDX for a Rh—Pt—Co alloy, and FIG. 9 depicts the EDX of PCMO on a Rh substrate treated with a $Pt_{0.2}Co_{0.8}$ ally. In addition to indications of Pr, Ca and Mn in the PCMO thin film, the elements of Rh, Pt and Co were also indicated in the substrate.

Thus, a method of substrate surface treatment for RRAM thin film deposition has been disclosed. It will be appreciated that further variations and modifications thereof may be made within the scope of the invention as defined in the appended claims.

We claim:

1. A method of fabricating a CMR thin film for use in a semiconductor device, comprising:
   preparing a CMR precursor in the form of a metal acetate based acetic acid solution;
   preparing a wafer;
   placing a wafer in a spin-coating chamber;
   spin-coating and heating the wafer according to the following:
   injecting the CMR precursor into a spin-coating chamber and onto the surface of the wafer in the spin-coating chamber;
   accelerating the wafer to a spin speed of between about 1500 RPM to 3000 RPM for about 30 seconds;
   baking the wafer at a temperature of about 180° C. for about one minute;
   ramping the temperature to about 230° C.;
   baking the wafer for about one minute at the ramped temperature;
   annealing the wafer at about 500° C. for about five minutes;
   repeating said spin-coating and heating steps at least three times;
   post-annealing the wafer at between about 500° C. to 600° C. for between about one to six hours in dry, clean air; and
   completing the semiconductor device.

2. The method of claim 1 wherein said preparing a wafer includes forming a layer of rhodium having a surface treatment of $Pt_{0.2}Co_{0.8}$ alloy thereon.

3. The method of claim 1 wherein said preparing includes forming a layer of Rh—Pt—Co alloy thereon.

4. The method of claim 1 wherein said preparing includes forming a layer of $SiO_2$ on a silicon wafer.

5. The method of claim 1 which includes programming the device by applying a writing pulse having an amplitude of at least 4.5V and a pulse width of at least 50 ns.

6. The method of claim 1 which includes programming the device by applying a reset pulse having a minimum pulse amplitude at least 2V and a pulse width of at least 2 µs.

7. A method of fabricating a CMR thin film for use in a semiconductor device, comprising:
   preparing a CMR precursor in the form of a metal acetate based acetic acid solution;
   preparing a wafer, including forming a layer of material on a silicon substrate, wherein the material is taken from the group of materials consisting of a layer of rhodium having a surface treatment of $Pt_{0.2}Co_{0.8}$ alloy thereon and a layer of Rh—Pt—Co alloy thereon;
   placing a wafer in a spin-coating chamber;
   spin-coating and heating the wafer according to the following:
   injecting the CMR precursor into a spin-coating chamber and onto the surface of the wafer in the spin-coating chamber;
   accelerating the wafer to a spin speed of between about 1500 RPM to 3000 RPM for about 30 seconds;
   baking the wafer at a temperature of about 180° C. for about one minute;
   ramping the temperature to about 230° C.;
   baking the wafer for about one minute at the ramped temperature;
   annealing the wafer at about 500° C. for about five minutes;
   repeating said spin-coating and heating steps at least three times;
   post-annealing the wafer at between about 500° C. to 600° C. for between about one to six hours in dry, clean air; and
   completing the semiconductor device.

8. The method of claim 7 wherein said preparing includes forming a layer of $SiO_2$ on a silicon wafer.

9. The method of claim 7 which includes programming the device by applying a writing pulse having an amplitude of at least 4.5V and a pulse width of at least 50 ns.

10. The method of claim 7 which includes programming the device by applying a reset pulse having a minimum pulse amplitude at least 2V and a pulse width of at least 2 μs.

11. A method of fabricating a CMR thin film for use in a semiconductor device, comprising:
    preparing a CMR precursor in the form of a metal acetate based acetic acid solution;
    preparing a wafer;
    placing a wafer in a spin-coating chamber;
    spin-coating and heating the wafer according to the following:
    injecting the CMR precursor into a spin-coating chamber and onto the surface of the wafer in the spin-coating chamber;
    accelerating the wafer to a spin speed of between about 1500 RPM to 3000 RPM for about 30 seconds;
    baking the wafer at a temperature of about 180° C. for about one minute;
    ramping the temperature to about 230° C.;
    baking the wafer for about one minute at the ramped temperature;
    annealing the wafer at about 500° C. for about five minutes;
    repeating said spin-coating and heating steps at least three times;
    post-annealing the wafer at between about 500° C. to 600° C. for between about one to six hours in dry, clean air;
    completing the semiconductor device; and
    programming the device by applying a writing pulse having an amplitude of at least 4.5V and a pulse width of at least 50 ns and by applying a reset pulse having a minimum pulse amplitude at least 2V and a pulse width of at least 2 μs.

12. The method of claim 11 wherein said preparing a wafer includes forming a layer of rhodium having a surface treatment of $Pt_{0.2}Co_{0.8}$ alloy thereon.

13. The method of claim 11 wherein said preparing includes forming a layer of Rh—Pt—Co alloy thereon.

14. The method of claim 11 wherein said preparing includes forming a layer of $SiO_2$ on a silicon wafer.

* * * * *